(12) United States Patent
Duvvury et al.

(10) Patent No.: US 6,933,741 B2
(45) Date of Patent: Aug. 23, 2005

(54) ELECTROSTATIC DISCHARGE TESTERS FOR UNDISTORTED HUMAN-BODY-MODEL AND MACHINE-MODEL CHARACTERISTICS

(75) Inventors: Charvaka Duvvury, Plano, TX (US);
John E. Kunz, Jr., Allen, TX (US);
Robert M. Steinhoff, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 10/870,773

(22) Filed: Jun. 17, 2004

(65) Prior Publication Data
US 2005/0104613 A1    May 19, 2005

Related U.S. Application Data

(60) Provisional application No. 60/519,732, filed on Nov. 13, 2003.

(51) Int. Cl.⁷ .............................................. G01R 31/26
(52) U.S. Cl. ..................................................... 324/765
(58) Field of Search ................................ 324/765, 759, 324/763, 764, 158.1, 519, 531, 527, 522, 324/523, 548, 549

(56) References Cited

U.S. PATENT DOCUMENTS 3,806,829 A * 4/1974 Duston et al. ........... 372/38.01
5,514,919 A * 5/1996 Walley ....................... 307/109

* cited by examiner

*Primary Examiner*—Vinh Nguyen
*Assistant Examiner*—Trung Q. Nguyen
(74) *Attorney, Agent, or Firm*—W. James Brady, III; Frederick J. Telecky, Jr.

(57) ABSTRACT

An equipment (400) for testing semiconductor device performance under high energy pulse conditions, which comprises a high voltage generator (401) and an on/off switch relay (403). The relay is resistively connected by a first resistor (402) to the generator and by a second resistor (404) to the socket (405a) for the device-under-test (406); the relay is operable in a partially ionized ambient. A capacitor (407) is connected to the relay, to the generator, and to the device, and is operable to discharge high energy pulses through the device. A third resistor (410) is in parallel with the capacitor and the device, and is operable to suppress spurious pulses generated by the relay. This third resistor has a value between about 1 kΩ and 1 MΩ, preferably about 10 kΩ, several orders of magnitude greater than the on-resistance of the device-under-test.

13 Claims, 2 Drawing Sheets

ELECTROSTATIC DISCHARGE TESTERS FOR UNDISTORTED HUMAN-BODY-MODEL AND MACHINE-MODEL CHARACTERISTICS

This application claims priority under 35 USC § 119 (e)(1) of provisional application No. 60/519,732, filed Nov. 13, 2003.

FIELD OF THE INVENTION

The present invention is related in general to the field of electronic systems and semiconductor devices and more specifically to method and equipment of testing semiconductor devices based to the human-body model and the machine model.

DESCRIPTION OF THE RELATED ART

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the "Machine model", MM); it can generate transients with significantly higher rise times and current levels than the HBM ESD source. A third source is described by the "charged device model" (CDM), in which the IC itself becomes charged and discharges to ground in rise times less than 500 ps.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an NMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions (the bipolar turn-on at snap-back occurs at the collector/drain voltage Vt1 with an associated collector/drain current It1), is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level. The second breakdown trigger current It2 is widely used as an ESD strength monitor.

It has recently been found that the relentless scaling trend in semiconductor technologies has made the ESD protection devices much more sensitive to noise generated by the high pin-count testers, which are routinely used to evaluate semiconductor products for sensitivity to HBM and MM stresses. A further trend is that IC products migrate towards high pin-count products. ESD testers, however, have not kept up with the increased parasitics of the high pin count sockets and boards that are used to test the ICs. Obviously, the testers have to be trustworthy in order to deliver undistorted pulses to evaluate the ESD robustness of semiconductor products, but the testers have been found to be severely lacking unambiguous testing performance. Noise pulses are generated by the testers during different time periods of an ESD event, both before and after the event; specifically, pulses trailing the ESD event were found which are not within the intended JEDEC or ESDA test methods. The trailing pulse can falsely cause oxide stress; as a result, the input parametrics of input high (VIH) and/or input low (VIL) can shift to undesirable levels and the units are declared a not passing ESD. Consequently, the test results have been found to be misleading with respect to the ESD evaluation of semiconductor products. Such false data may not only lead to wasted resources, lost time, and customer misunderstanding, but also lead to situations where true versus false ESD levels are not determined properly.

SUMMARY OF THE INVENTION

An urgent need has therefore arisen for trustworthy HBM and MM test methods and cost effective equipment modifications to achieve test results, which describe the real ESD characteristics of semiconductor products. The buildup of voltage at the end of an ESD event (shift if VIH/VIL), which has been found to be caused by an unexpected stress current supplied by the ESD tester, must be eliminated.

One embodiment of the invention is an equipment for testing semiconductor device performance under high energy pulse conditions, which comprises a high voltage generator and an on/off switch relay. The relay is resistively connected by a first resistor to the generator and by a second resistor to the socket for the device-under-test; the relay is operable in a partially ionized ambient. A capacitor is connected to the relay, to the generator, and to the device, and is operable to discharge high energy pulses through the device. A third resistor is in parallel with the capacitor and the device, and is operable to suppress spurious pulses generated by the relay. This third resistor has a value between about 1 kΩ and 1 MΩ, preferably about 10 kΩ, several orders of magnitude greater than the on-resistance of the device-under-test.

Another embodiment of the invention is a method for testing the ability of a semiconductor device to withstand high energy pulses. The method comprises the steps of providing a test equipment operable to supply controlled outputs of electrostatic discharge (ESD) simulator pulses to a socket for a device-to-be-tested; inserting a semiconductor device into the socket for testing; and activating the equipment to trigger the pulses, which simulate an ESD event, for testing the device. Concurrently with the activation, spurious pulses both preceding and trailing the ESD event are suppressed. The method includes adding a resistor in parallel to the test socket and adjusting the resistor to a value so that it controls the suppression of the pulse trailing the ESD event to a duration of about 10 μs.

Embodiments of the present invention are related to the testing of advanced deep submicron technology devices with shallow trench isolation, especially salicided nMOS transistors. Such transistors are for instance employed in wireless devices, or in Application Specific products, or in mixed signal and logic devices.

A technical advantage of the invention is its simplicity so that it can easily be adopted into any ESD tester and integrated circuit testing methodology.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1A:
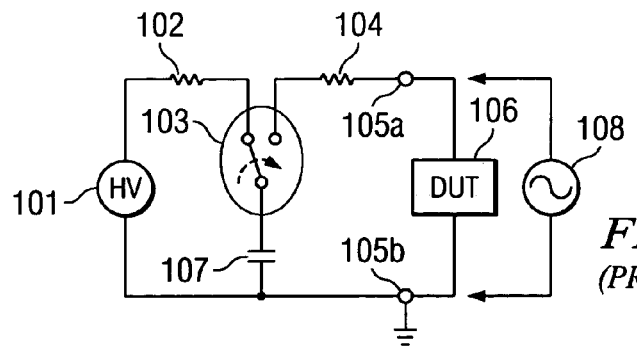
FIG. 1A shows a schematic and simplified circuit diagram of the ESD tester as used in known technology for testing a semiconductor device according to the Human Body Model.
Figure 1B:
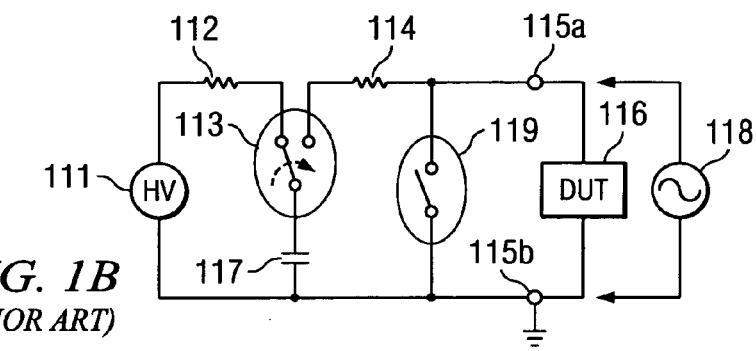
FIG. 1B shows a schematic and simplified circuit diagram of the ESD tester as used in known technology for testing a semiconductor device according to the Machine Model.

The impact of the invention can be most easily appreciated when compared with the shortcomings of the known technology. FIG. 1A depicts a schematic and simplified circuit diagram of the ESD testers as they are routinely employed by known technology to test semiconductor product from various technologies according to the requirements of the Human Body Model (HBM). FIG. 1B depicts a similarly schematic and simplified circuit diagram of ESD testers for testing semiconductor products according to the requirements of the Machine Model (MM). The high voltage generator 101 delivers about 8 kV (up to 15 kV) and is connected, through first resistor 102 of about 1 to 5 MΩ, to the on/off switch relay 103. Typically, commercial testers employ relays 103 which operate in a partially ionized ambient and are thus inclined to arc; in the case of arcing, the high voltage supply 101 is able to provide a leakage current.

Relay 103 is connected, through a second resistor 104 of about 1.5 kΩ, to the sockets 105*a* and 105*b* for the device-under-test 106. Socket 105*b* is at ground potential. A capacitor 107 of about 100 pF is connected to relay 103, to the high voltage generator 101, and to the socket 105*b* for the device-under-test 106. Capacitor 107 is operable to discharge high energy pulses through device 106. An oscilloscope 108 monitors the observed voltage versus time waveforms, which are experienced by device 106.

The tester in FIG. 1B for the MM is aimed at simulating abrupt discharge events, which are caused by contact with equipment and empty sockets, for instance in functional device tests, burn-in, and reliability testing. The model is sensitive to parasitics; control of the testers to comply with standards is difficult. High voltage source 111 delivers up to 15 kV; resistor 112 is typically between about 1 to 10 MΩ, while the resistor 114 may be as low as 0 Ω. The first on/off switch relay 113 operates in a partially ionized ambient and is thus inclined to arc, in that case, the high voltage supply 111 is able to provide a leakage current. Between sockets 115*a* and 115*b* for the device-under-test 116 is the second switch 119. Capacitor 117 is about 200 pF. An oscilloscope 118 monitors the observed voltage versus time waveforms, which are experienced by device 116.

Figure 2:
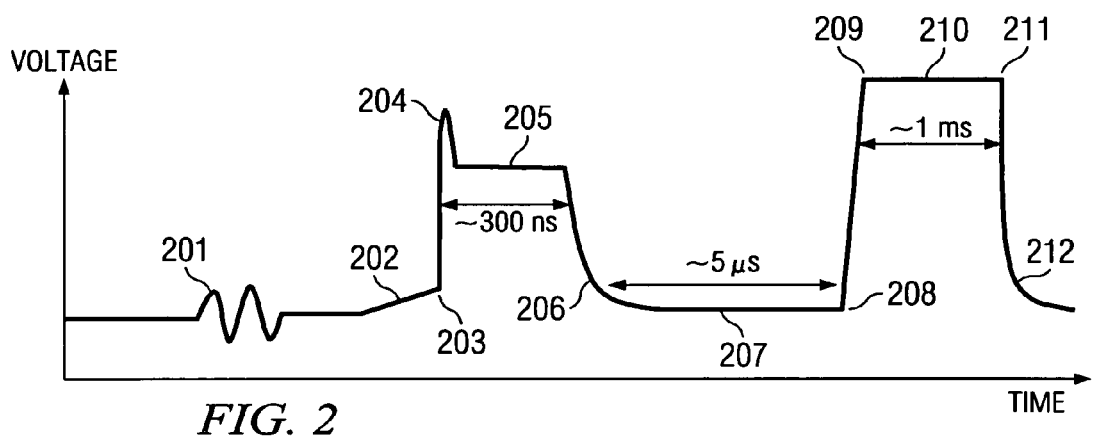
FIG. 2 illustrates schematically the voltage observed at the tester socket as a function of time.

FIG. 2 records schematically the voltage (ordinate) versus time (abscissa) waveforms experienced by a contemporary device 106, produced in scaled technology, in socket 105, using an HBM and MM tester according to the schematic diagrams of FIGS. 1A and 1B. It should be pointed out that the time axis of FIG. 2 is not to scale. The region 201 shows some erratic early rise ringing due to electromagnetic cable interference (coupling between relay and cables). At 203, the circuit switch is being closed and the HBM test starts. Just prior, at 202, some voltage pre-charge due to arcing is recorded; this region is not part of the test standard and could give rise to false ESD results.

At 204, some inductive ringing due to the fast dV/dt is seen, just prior to the triggering of the ESD protection device at 205. The protection device clamps at about 5 to 6 V. The length of time of the protection device action is listed as approximately 0.3 μs before the end of the HBM test at 206. During the long turn-off of the ESD event, the decaying current has first the voltage at zero for a length of time of approximately 5 μs (curve portion 207 in FIG. 2) and then brings the protection device out of snapback at point 208, rising the potential to its Vt1 of about 9.3 V (point 209 in FIG. 2).

Long after the ESD pulse is expected to be over (after about 5 to 20 μs), a trailing pulse begins at 209 and continues for a surprisingly long duration of about 700 to 1000 μs (curve portion 210), before it terminates at 211 and starts to lowly decrease at 212. In this critical region, a current of about 300 μA is seen, supplied by the high voltage source (101 in FIG. 1). The origin of this misleading trailing pulse is an arcing in the test relay, where the high voltage supply provides the leakage current. This current magnitude is proportional to the stress voltage level. The renewed clamping is again at about 9.3 V, since current is supplied to the protection device to only reach its Vt1. Clearly, region 210 is not part of the test standard and gives rise to false ESD results. The duration of region 210 coupled with the magnitude of the current causes frequently a degradation of the oxide layer of the device-under-test, producing an erroneous failure result. For the thin oxide layer of many products, a current of 10 μA, flowing for a period of about 1000 μs, is already enough to damage the oxide layer.

The trailing pulse 210 is caused is caused by the way the ESD tester charges its capacitor and by a phenomenon inside the high voltage relay. Typically, the high voltage supply inside the tester is connected to the charge storage capacitor through a high value resistor, on the order of 1 to 10 MΩ and the normally closed contact of the high voltage relay. The intent is that, when the relay is activated, the capacitor will be disconnected from this charging source and connected to the about 1.5 kΩ resistor and device-under-test. What actually happens, though, is that when the relay actuates, there is a trail of ionized gas or plasma between the normally closed contact and the armature. The armature swings over to the normally open contact and the capacitor discharges into the device-under-test, causing the desired ESD stress, but the charging circuit is still connected to the armature via the plasma. This means that the ESD stress does not decay to zero as intended, but decays down to the value of the charging current, which may be as high as hundreds of $\mu$A. This charging current remains applied to the device-under-test until the plasma dissipates, typically in about 1 ms. This long tail or trailing pulse is not something seen in the real world because the charging source is not continuously applied to people. They build up a charge from moving around and then hold the charge until they touch something. After they discharge, there is no charging current to flow into the pin.

Figure 3:
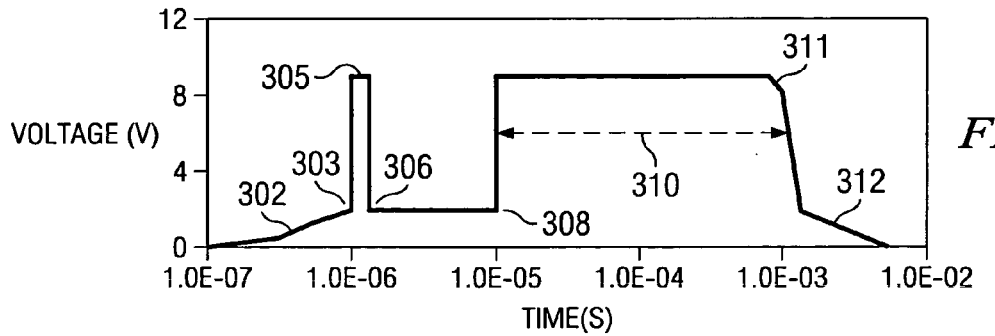
FIG. 3 displays the voltage vs. time curve of FIG. 2 in a simplified manner to highlight its important features.

The HBM voltage curve in FIG. 3 repeats the essential elements of the curve in FIG. 2, redrawn onto a more quantitative voltage ordinate and logarithmic time abscissa. Pre-charge curve portion 302 corresponds to curve portion 202; the HBM test starts at 303. The voltage level 305 (typically between 8 to 9 V) is determined by the clamp device. The HMB test ends at 306. At 308, the misleading trailing pulse begins and lasts for the time period 310, before it subsides at 311 and slowly decays at 312.

Figure 4:
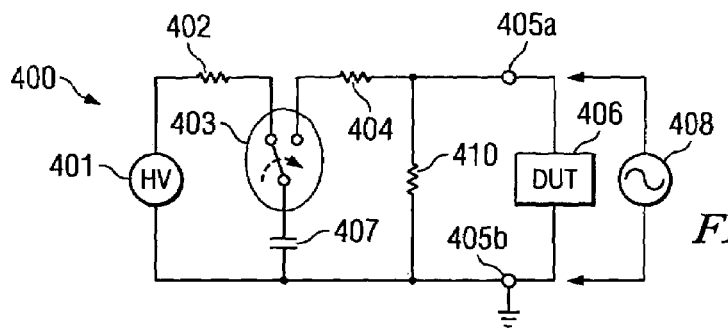
FIG. 4 shows the schematic and simplified circuit diagram of an embodiment of the invention, displaying the modified ESD tester for testing a semiconductor device according to the Human Body Model and the Machine Model.

FIG. 4 illustrates schematically the simplified circuit diagram of an embodiment of the invention, in which the tester, generally designated 400, is modified such that the extraneous pulses are removed to yield a clean HBM or MM pulse with the intended test. The high voltage generator 401 delivers up to about 8 kV and is connected, through first resistor 402 of about 1 to 5 M$\Omega$, to the on/off switch relay 403. Typically, relay 103 operates in a partially ionized ambient and may thus be inclined to arc; in the case of arcing, the high voltage supply 401 provides leakage current.

Relay 403 is connected, in series with a second resistor 404 of about 1.5 k$\Omega$, to the sockets 405a for the device-under-test 406; socket 405b is at ground potential. A capacitor 407 of about 100 pF and dimensioned for about 2 to 8 kV is connected to relay 403, to the high voltage generator 401, and to the socket 405b for the device-under-test 406. Capacitor 407 is operable to discharge high energy pulses through device 406. An oscilloscope 408 monitors the observed voltage versus time waveforms, which are experienced by device 406.

A third resistor 410 of between about 10 k$\Omega$ to 1 M$\Omega$ is in parallel with capacitor 407 and device-under-test 406. Resistor 410 is set to be operable to suppress spurious pulses generated by relay 403; its magnitude is several orders of magnitude greater than the on-resistance of device-under-test 406. A preferred value of resistor 410 is 10 k$\Omega$. In another preferred embodiment, resistor 410 comprises more than one resistor, each set to a value between 1 k$\Omega$ and 1 M$\Omega$.

Figure 5:
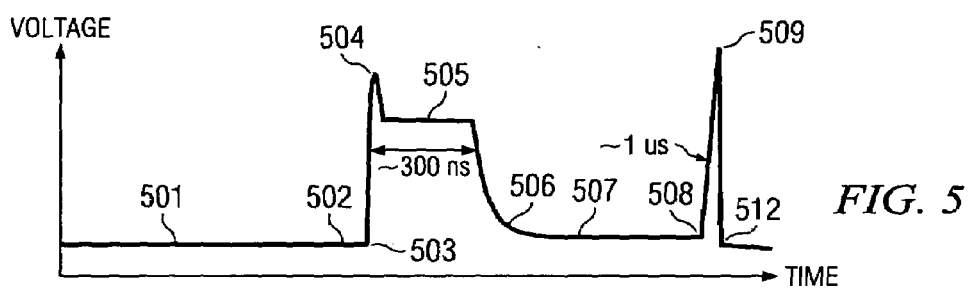
FIG. 5 illustrates schematically the voltage observed at the tester socket as a function of time.

Resistor 410 does not degrade the HBM or MM voltage and current waveforms so that they continue to meet JEDEC standards. An example of the voltage waveform across device 406, provided by a tester according to the invention, is shown schematically in FIG. 5. The voltage is plotted linearly on the ordinate, and the time on the abscissa is not to scale. The contrast of this waveform to the unimproved standard version in FIG. 2 is evident. There is no early rise ringing in curve portion 501. There is no pre-charge in curve portion 502 before the start of the HBM test at 503 by closing the circuit switch. At 504, some inductive ringing due to the fast dV/dt is seen, just prior to the triggering of the ESD protection device at 505. The protection device clamps at about 5 to 6 V. The length of time of the protection device action is shown as approximately less than 1.0 $\mu$s before the end of the HBM test at 506. During the time period of the test, the current amplitude of the test pulse shows very little change compared to the current amplitude of the pulse in FIG. 3, since the resistor 410 is much larger than the on-resistance of the device-under-test. The operation of the protection device is undisturbed and the current decays as anticipated; the voltage is at zero in regime 507.

While the relay of the tester used in FIG. 2 brings the protection device out of snapback after a few microseconds so that it rises to its vt1 potential of about 9.3 V and draws a current of about 300 $\mu$A, supplied by the high voltage generator, for an excessively long trailing pulse of approximately 1000 $\mu$s, there is nothing like it by the tester with the embodiment of the invention. As FIG. 5 demonstrates, a small residual pulse 509 having very little current may get started at 508 as a discharge from resistor 410, but the pulse has expired at 512 after a very short duration of about 1 $\mu$s. Moreover, the voltage rapidly deceases instead of being constant as in FIG. 2. Consequently, there are no degradation effects on thin oxide layers in the device-under-test and thus no false ESD test results.

Figure 6:
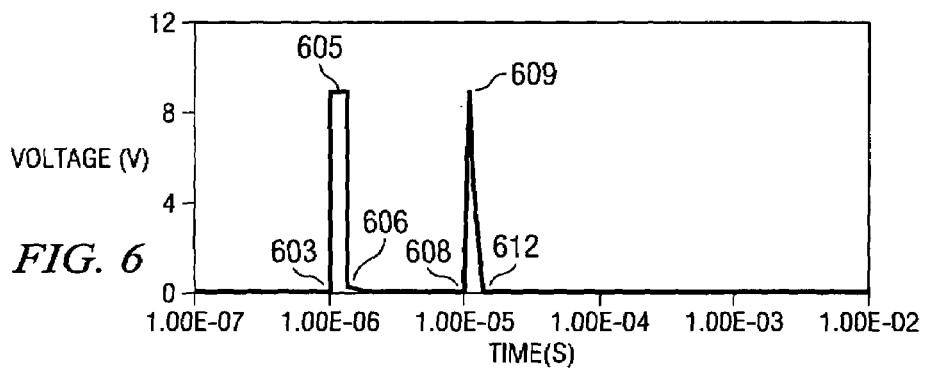
FIG. 6 displays the voltage v. time curve of FIG. 7 in a simplified manner to highlight its important features.

This improved situation is confirmed by the quantitative HBM voltage graph of FIG. 6, which uses the same voltage ordinate and logarithmic time abscissa as FIG. 3 in order to allow a direct comparison of the oscilloscope readings. There are no early rise ringing and no pre-charge curve portions before the start of the HBM test at 603 (closing of the circuit switch). The voltage level 605 (typically between 8 to 9 V) is determined by the clamp device. The current level during HBM test The HMB test ends at 606. After about 5 to 10 $\mu$s, there is a short pulse at 608 as a discharge from resistor 410; pulse 609 is inconsequential because its duration is only about 1 $\mu$s and it carries only little current; the pulse expires at 612. The long trailing pulse, which appeared in FIG. 3, is now suppressed, since the resistor 410 is integrated into the tester of FIG. 6 as an embodiment of the invention. Pulse 609 does not have enough energy to cause nay degradation of an oxide layer in the device-under-test.

Figure 7:
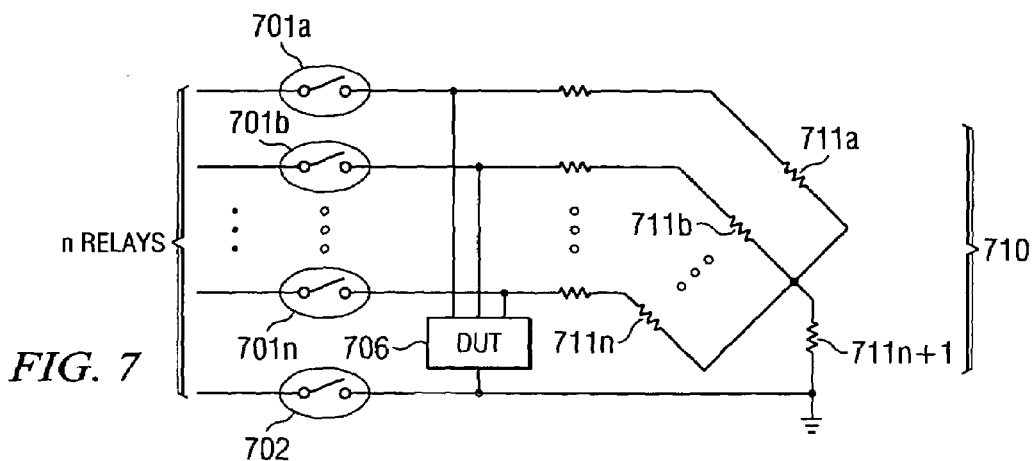
FIG. 7 show the schematic and simplified circuit diagram of another embodiment of the invention.

Another embodiment of the invention provides fine-tuning of the parallel resistor in order to adjust the appropriate resistor value in small increments to any given relay, i.e., the full incorporation into a high pin-count tester. This manner of inserting the resistor into the tester provides controllable improvements of the HBM ESD voltage waveform. FIG. 7 illustrates a portion of a schematic circuit diagram of a tester, which incorporates this other embodiment of the invention. The total resistor 710 of value R, which is connected parallel to the device-under-test 706, is distributed in (n+1) portions 711a, 711b, . . . , 711n, 711(n+1), each having the value R°, so that their sum of value R is between R° and 2R°:

$$R° < R < 2R°.$$

As FIG. 7 illustrates, the adjustable total resistor R can be achieved by arranging the resistor components 711a, 711b, up to 711n in parallel, and connecting the last component 711(n+1) in series with the first group.

Using this resistor arrangement, n "hot" relays 701a, 701b, . . . , 701n are respectively connected in series with the resistors components 711a, 711b, . . . , 711n, and individually connected with the device-under-test 706, forming a relay network as shown in FIG. 7. Relay 702, also connected to device 706, is at ground potential. The n relays 701 and relay 702 are powered by a high voltage generator (not shown in FIG. 7); when closed, they discharge a capacitor (not shown in FIG. 7) for creating the ESD stress pulse so that the true nature of the HBM and MM events are preserved and spurious pulses are suppressed.

The same concept of controllable parallel resistors can be applied to conventional MM testers, where the ringing of the waveform can be severe and can vary from tester to tester. The embodiment of the invention brings uniformity to the testers and improves their true representation to MM and HBM stress for measuring IC reliability.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor or compound material used in IC manufacturing. As another example, the testers may comprise equipment for HBM stresses and MM stresses. It is therefore intended that the appended claims encompass any such modifications or embodiments.

We claim:

1. An equipment for testing semiconductor device performance under high energy pulse conditions, comprising:
   a high voltage generator;
   an on/off switch relay resistively connected by a first resistor to said generator and by a second resistor to the socket for the device-under-test, said relay operable in a partially ionized ambient;
   a capacitor connected to said relay, to said generator, and to said device, said capacitor operable to discharge high energy pulses through said device; and
   a third resistor in parallel with said capacitor and said device, said third resistor operable to suppress spurious pulses generated by said relay.

2. The equipment according to claim 1 wherein said third resistor is set to a value between about 1 k$\Omega$ and 1 M$\Omega$, several orders of magnitude greater than the on-resistance of said device-under-test.

3. The equipment according to claim 1 wherein said third resistor has a value of about 10 k$\Omega$.

4. The equipment according to claim 1 wherein said third resistor comprises more than one resistors, each set to a value between 1 k$\Omega$ and 1 M$\Omega$.

5. The equipment according to claim 1 wherein said third resistor is inserted between the pins of said socket.

6. The equipment according to claim 1 wherein said third resistor is inserted at said relay network.

7. The equipment according to claim 1 wherein said spurious pulses are generated before or after said high voltage pulses.

8. The equipment according to claim 1 wherein said first resistor has a value of about 1 M$\Omega$.

9. The equipment according to claim 1 wherein said second resistor has a value between about 1 and 2 k$\Omega$.

10. The equipment according to claim 1 wherein said high voltage generator generates voltage levels up to about 8 kV.

11. A method for testing the ability of a semiconductor device to withstand high energy pulses, comprising the steps of:
    providing a test equipment operable to supply controlled outputs of electrostatic discharge (ESD) simulator pulses to a socket for a device-to-be-tested;
    inserting a semiconductor device into said socket for testing;
    activating said equipment to trigger said pulses, which simulate an ESD event, for testing said device; and
    concurrently suppressing spurious pulses both preceding and trailing said event.

12. The method according to claim 11 further comprising the step of adding a resistor in parallel with said socket and adjusting said resistor to a value so that it controls said suppression of the pulse trailing said event to a duration of about 10 $\mu$s.

13. The method according to claim 12 wherein said value of said resistor is between about 1 k$\Omega$ and 1 M$\Omega$.

* * * * *